(12) United States Patent
Yamagami et al.

(10) Patent No.: US 8,767,484 B2
(45) Date of Patent: Jul. 1, 2014

(54) SEMICONDUCTOR DEVICE

(76) Inventors: Minoru Yamagami, Tokyo (JP);
Hisayuki Nagamine, Tokyo (JP)

( * ) Notice: Subject to any disclaimer, the term of this patent is extended or adjusted under 35 U.S.C. 154(b) by 70 days.

(21) Appl. No.: 13/489,984

(22) Filed: Jun. 6, 2012

(65) Prior Publication Data

US 2012/0314471 A1  Dec. 13, 2012

(30) Foreign Application Priority Data

Jun. 7, 2011  (JP) .................................. 2011-127003

(51) Int. Cl.
*G11C 5/14*  (2006.01)
(52) U.S. Cl.
CPC ...................................... *G11C 5/147* (2013.01)
USPC .......... 365/189.09; 365/189.011; 365/230.01; 365/230.06; 365/196; 365/207
(58) Field of Classification Search
CPC .. G11C 16/04; G11C 16/26; G11C 29/12005; G11C 11/4074; G11C 11/4091; G11C 5/14; G11C 7/06; G11C 7/065
USPC .................. 365/63, 189.011, 189.09, 230.01, 365/230.06, 196, 207, 226
See application file for complete search history.

(56) References Cited

U.S. PATENT DOCUMENTS

| 6,169,699 | B1 | 1/2001 | Muraoka | |
| 2001/0046149 | A1* | 11/2001 | Hidaka | ........................... 365/63 |
| 2008/0151674 | A1 | 6/2008 | Ohata et al. | |

FOREIGN PATENT DOCUMENTS

| JP | 2000-195252 A | 7/2000 |
| JP | 2008-159188 A | 7/2008 |

* cited by examiner

*Primary Examiner* — Thong Q Le
(74) *Attorney, Agent, or Firm* — Sughrue Mion, PLLC

(57) ABSTRACT

A semiconductor device comprises a first region and a second region. The first region includes a plurality of memory cells each of which holds respective data and a plurality of sense amplifiers that respectively amplify the data in the plurality of memory cells, based on a first voltage. The second region is provided along one side of the first region and includes a first power supply generation circuit that generates the first voltage, based on a second voltage. The second voltage being supplied to the first power supply circuit by a first power supply interconnect extends on the first region in a first direction parallel to the one side of the first region.

20 Claims, 19 Drawing Sheets

SEMICONDUCTOR DEVICE

REFERENCE TO RELATED APPLICATION

This application is based upon and claims the benefit of the priority of Japanese patent application No. 2011-127003, filed on Jun. 7, 2011, the disclosure of which is incorporated herein in its entirety by reference thereto.

TECHNICAL FIELD

The present invention relates to a semiconductor device. More specifically, the invention relates to a semiconductor device including memory cells and sense amplifiers.

BACKGROUND

In semiconductor devices including DRAMs (Dynamic Random Access Memories), write data is held in a memory cell array in which memory cells are arranged. Further, the semiconductor devices include sense amplifiers each for amplifying data read from a memory cell to a level that can be handled as a digital signal.

A demand such as chip size reduction is constantly present for the semiconductor devices.

Patent Document 1 discloses a DRAM having a multi-bank configuration capable of transferring data at high speed without causing an increase in chip size due to an increase in power supply interconnect width or addition of an internal power supply circuit. Patent Document 1 discloses that the width of a power supply interconnect needs to be wider than the width of a signal interconnect to transfer a signal, and that, in view of the width of the power supply interconnect, reduction of the number of power supply interconnects strongly influences reduction of the chip size.

Further, Patent Document 2 discloses a technique of setting a target potential of a sense amplifier to an array voltage VARY and accelerating a sense operation by using a voltage (overdrive voltage, VOD) that is higher than the array voltage VARY.

FIG. 2 is a diagram showing an example of an overdrive circuit used for each sense amplifier. Reference characters VDDSA and VSSA shown in FIG. 2 denote power supplies to be used when the sense amplifier amplifies data from a memory cell, and reference character VOD/VARY indicates a voltage to be supplied to the power supply VDDSA. By appropriately controlling each of control signals (VOD_ACT, VARY_ACT, and VSS_ACT) in FIG. 2, the voltage VOD which is higher than the voltage VARY is supplied to the power supply VDDSA at a beginning of a charging period. As a result, a period of time for charging from a precharge level to the voltage VARY can be reduced.

PATENT DOCUMENT 1

JP Patent Kokai Publication No. JP2000-195252A, which corresponds to U.S. Pat. No. 6,169,699.

PATENT DOCUMENT 2

JP Patent Kokai Publication No. JP2008-159188A, which corresponds to US2008/151674A1.

SUMMARY

The disclosures of the above Patent Documents are incorporated herein in their entirety by reference thereto. The following analysis is given by the present invention.

A plurality of memory cells are present, and a plurality of sense amplifiers are also present, corresponding to the respective memory cells, in a semiconductor device. The sense amplifiers and power supply circuits for the sense amplifiers are disposed in a region referred to as an array region. Further, a circuit for generating a voltage to be supplied to the power supply circuits for the sense amplifiers is disposed in a region referred to as an amplifier region. A circuit for generating a voltage to be supplied to this voltage generation circuit in the amplifier region is often disposed on an outer periphery of the semiconductor device.

FIG. 3 is a diagram showing an example of a relationship among these power supply generation circuits. As shown in FIG. 3, an interconnect for providing a power supply to each of the sense amplifiers located in the inside (array region) of the semiconductor device extends from the outer periphery of the semiconductor device to each of the power supply circuits for the sense amplifiers via the amplifier region. An interconnect from the outer periphery of the semiconductor device and an interconnect toward each of the power supply circuits for the sense amplifiers are therefore present in the amplifier region. Details of a layout and the amplifier region of the semiconductor device will be described later.

In the amplifier region, the area of a region for various interconnects is larger the size of circuit elements, for the reason as described above. When the area of the amplifier region increases, the chip size of the semiconductor device will increase. Especially when a plurality of the amplifier regions are laid out stacked in a plurality of layer stages, the area of one amplifier region will influence the chip size in proportion to the number of the layer stages.

As described above, there is a problem to be solved in a semiconductor device including sense amplifiers. For that reason, a semiconductor device is desired in which chip size reduction is achieved.

According to a first aspect of the present invention, there is provided a semiconductor device, comprising a first region and a second region. The first region includes a plurality of memory cells each of which holds respective data and a plurality of sense amplifiers that respectively amplify the data in the plurality of memory cells, based on a first voltage. The second region is provided along one side of the first region and includes a first power supply generation circuit that generates the first voltage, based on a second voltage. The second voltage being supplied to the first power supply circuit via a first power supply interconnect extends on the first region in a first direction parallel to one side of the first region. Note the term "interconnect" used herein denotes "wiring", "wiring trace", "connector line", or the like.

According to a second aspect of the present invention, there is provided a semiconductor device, comprising a memory cell array region and an amplifier region. The memory cell array region includes a plurality of memory cells, a plurality of sense amplifiers, a plurality of subword drivers and a plurality of sense amplifier power supply circuits. Each of plurality of memory cells holds respective data associated with each of the memory cells. The plurality of sense amplifiers respectively amplify the data in the plurality of memory cells, based on an array voltage and an overdrive voltage. The plurality of sense amplifier power supply circuits are provided in a plurality of crossing regions respectively surrounded by a plurality of sense amplifier regions and a plurality of subword driver regions. The plurality of sense amplifier power supply circuits supply power to the sense amplifiers, the sense amplifier regions being respectively assigned to the sense amplifiers and the subword driver regions being respectively assigned to the subword drivers.

An amplifier region, disposed along one side of the memory cell array region, includes an array voltage generation circuit and an overdrive voltage generation circuit. The array voltage generation circuit generates the array voltage based on a first peripheral voltage. The overdrive voltage generation circuit generates the overdrive voltage, based on a second peripheral voltage. The first peripheral voltage is supplied to the array voltage generation circuit via a first power supply interconnect extending on the memory cell array in a first direction parallel to the one side of the memory cell array region. The second peripheral voltage is supplied to the overdrive voltage generation circuit via a second power supply interconnect extending on the memory cell array in the first direction. The array voltage generation circuit includes at least one array voltage control unit and a plurality of array voltage output units whose active state and inactive state are determined by the array voltage control unit. The overdrive voltage generation circuit includes at least one overdrive voltage control unit and a plurality of overdrive voltage output units whose active and inactive states are determined by the overdrive voltage control unit. The array voltage and the overdrive voltage are supplied from each of the crossing regions to each of the sense amplifier circuits via an array power supply interconnect and an overdrive power supply interconnect extending in a second direction orthogonal to the first direction.

According to each aspect of the present invention, there is provided a semiconductor device in which chip size reduction is achieved.

PREFERRED MODES

First, an overview of an exemplary embodiment will be described, using FIG. 1. Reference symbols to the drawings added to this overview are added to respective elements, for convenience, as an example for helping understanding of the present disclosure, and are not intended for limiting the present invention to the illustrated mode.

As described above, in an amplifier region of a semiconductor device, the area of a region for various interconnects is larger than the size of circuit elements. This impedes reduction of the chip size of the semiconductor device. For that reason, there is desired a semiconductor device whose amplifier region is reduced to achieve chip size reduction.

Figure 1:
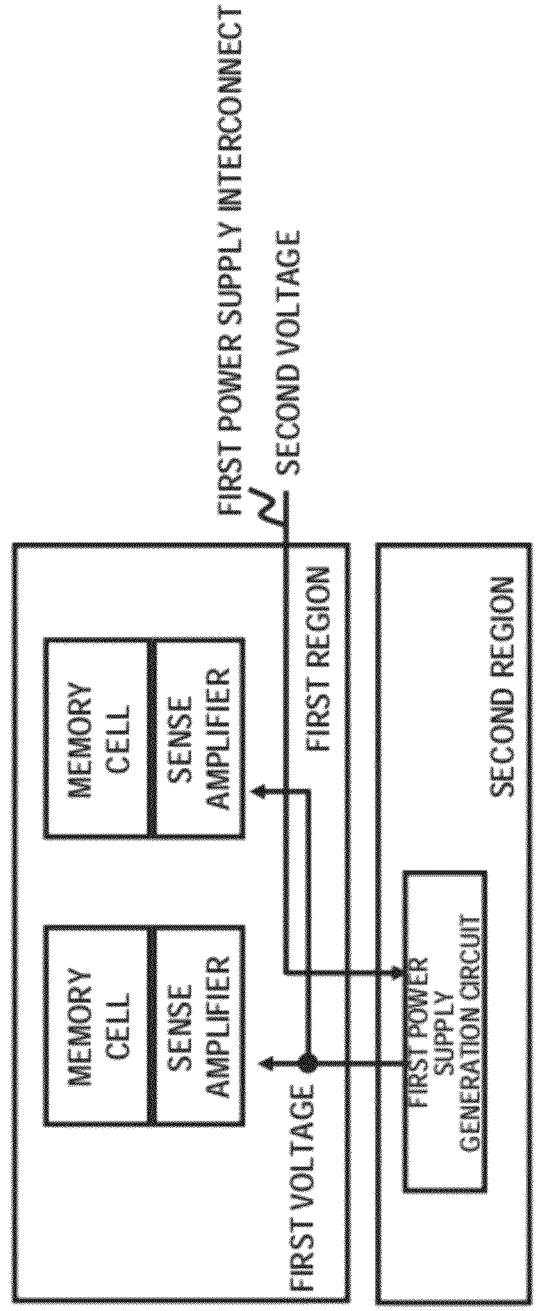
FIG. 1 is a diagram for explaining an overview of an exemplary embodiment of the present disclosure.

Then, a semiconductor device shown in FIG. 1 is provided as an example. The semiconductor device shown in FIG. 1 includes a first region and a second region. The first region includes a plurality of memory cells each of which holds respective data and a plurality of sense amplifiers that respectively amplify data in the memory cells, based on a first voltage. The second region is provided along one side of the first region, and includes a first power supply generation circuit that generates the first voltage, based on a second voltage. The second voltage is supplied to the first power supply generation circuit via a first power supply interconnect extending on the first region in a first direction parallel to the one side of the first region.

As shown in FIG. 1, the first power supply interconnect that is necessary when the second voltage is supplied to the first power supply generation circuit is extended on the first region (such as a memory cell array region) rather than the second region (such as an amplifier region). As a result, an interconnect occupancy in the second region is reduced. The area of the second region (amplifier region) can be thereby reduced. Accordingly, reduction of the chip size of the semiconductor device can be achieved.

Next, details of a layout and the amplifier region of the semiconductor device will be described. First, an overview of the semiconductor device will be described.

Figure 4:
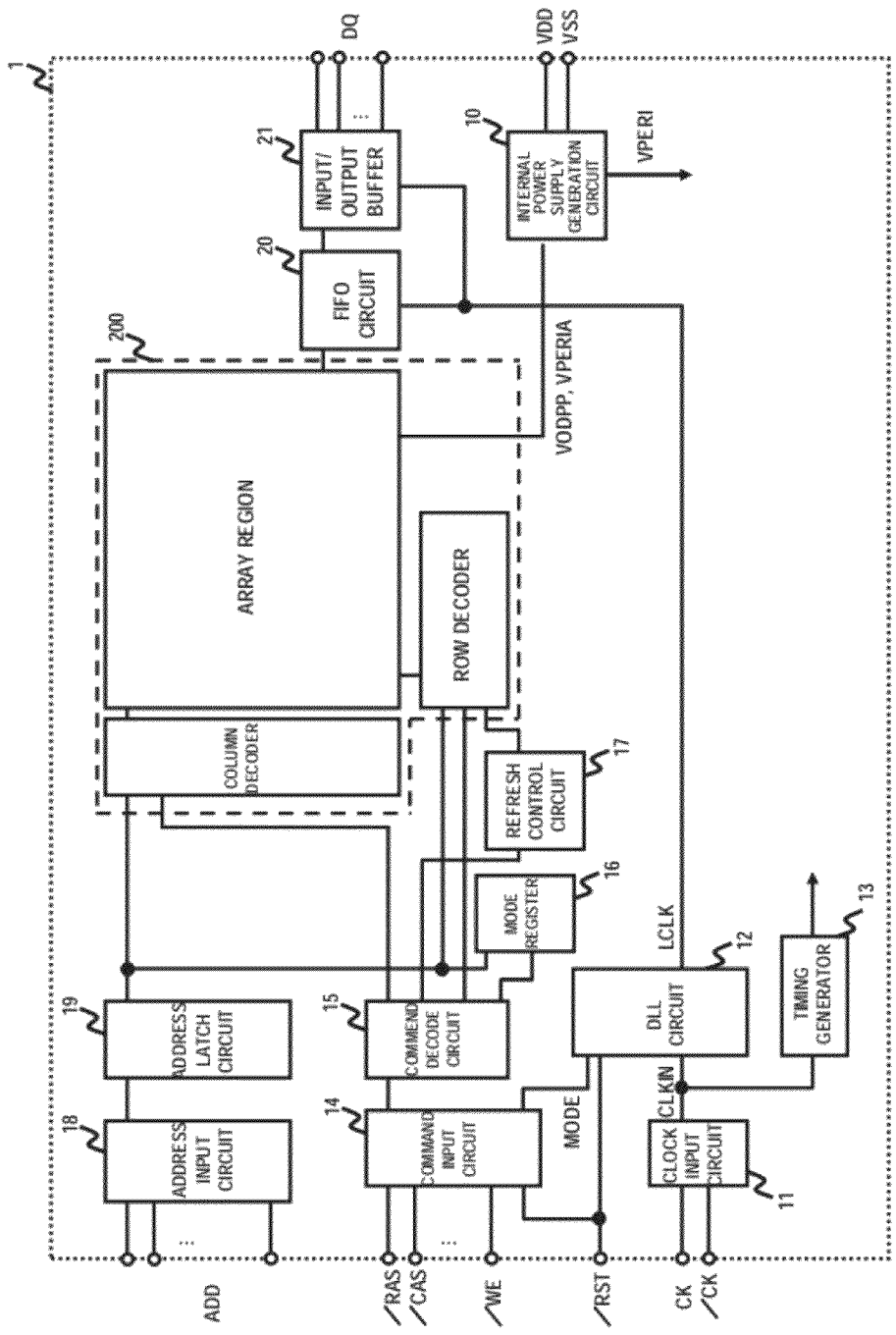
FIG. 4 is a diagram showing an example of an overall configuration of a semiconductor device.

FIG. 4 is a diagram showing an example of an overall configuration of a semiconductor device 1. The semiconductor 1 includes terminals such as command terminals (/RAS, /CAS, /WE), a reset terminal (/RST), address terminals ADD, power supply terminals (VDD, VSS), clock terminals (CK, /CK), and data terminals DQ.

The semiconductor device 1 shown in FIG. 4 is constituted from an internal power supply generation circuit 10, a clock input circuit 11, a DLL circuit 12, a timing generator 13, a command input circuit 14, a command decode circuit 15, a mode register 16, a refresh control circuit 17, an address input circuit 18, an address latch circuit 19, a FIFO circuit 20, an input/output buffer 21, and an array region 200.

The internal power supply generation circuit 10 generates voltages (VODPP, VPERIA, VPERI) to be used in an inside of the semiconductor device 1. The voltage VODPP is a voltage to be used for generating an overdrive voltage VOD, and the voltage VPERIA is a voltage for generating an array voltage VARY. The voltage VOD or the voltage VARY corresponds to the first voltage mentioned above, and the voltage VODPP or the voltage VPERIA corresponds to the second voltage.

The voltage VPERIA is a voltage to be also used for operation of a peripheral circuit, in addition to be used for generating the voltage VARY. Like the voltage VPERIA, the voltage VPERI is used for the operation of the peripheral circuit.

The clock input circuit 11 receives differential clocks (CK, /CK) supplied from the outside of the semiconductor device 1 to output a single-phase clock CLKIN.

The DLL circuit 12 delays the single-phase clock CLKIN, thereby generating an internal clock LCLK.

The timing generator 13 generates a signal for achieving synchronization of a control signal to be used in the inside of the semiconductor device 1.

A command for the semiconductor device 1 is received by the command input circuit 14 through the command terminals. Specifically, the command formed of a row address strobe signal /RAS, a column address strobe signal /CAS, and a write enable signal /WE and the like is received. The command formed of these signals is decoded by the command decode circuit 15, and a result of decoding is output to the mode register 16 and the array region 200.

The mode register 16 holds an operation mode of the semiconductor device 1 set by a mode register set (MRS) command issued from an outside of the semiconductor device 1.

The refresh control circuit 17 controls a refresh operation for a memory cell when the refresh control circuit 17 receives a refresh command from the outside of the semiconductor device 1.

An address signal issued from the outside of the semiconductor device 1 is received by the address input circuit 18, and is then latched by the address latch circuit 19. The address signal is supplied to the mode register 16 and a column decoder and a row decoder in the array region 200.

The array region 200 will be described later, together with the layout of the semiconductor device 1.

When data is read or written, the data read from a selected memory cell is output from the data terminal DQs through the FIFO circuit 20 and the input/output buffer 21. When the data is written, the write data supplied to the data terminals DQ is written into a selected memory cell through the input/output buffer 21 and the FIFO circuit 20.

Next, the layout of the semiconductor device 1 will be described.

Figure 5:
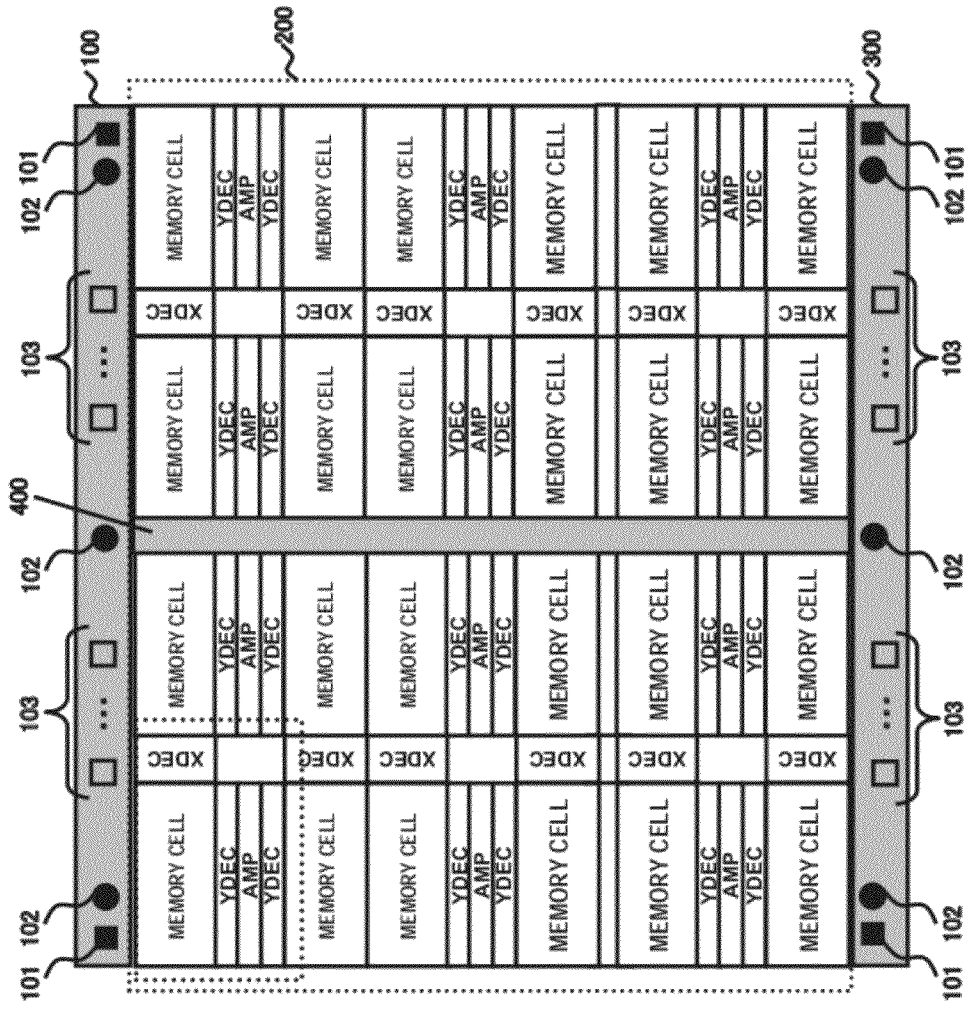
FIG. 5 is a diagram showing an example of a layout of the semiconductor device shown in FIG. 4.

FIG. 5 is a diagram showing the layout of the semiconductor device 1. In the semiconductor device 1, an address-side peripheral region 100 to which the address terminals ADD and the like are connected, the array region 200 formed of memory cell arrays, the column decoders, and the like, a data-side peripheral region 300 to which the data terminals DQ and the like are connected, and a central peripheral region 400 are laid out.

A plurality of pads 103 for being connected to the address terminals ADD and the like are present in the address-side peripheral region 100. Further, a plurality of VODPP voltage generation circuits 101 and a plurality of VPERIA voltage generation circuits 102 are present in the address-side peripheral region 100.

The VODPP voltage generation circuits 101 and the VPERIA voltage generation circuits 102 are circuits that constitute a portion of the internal power supply generation circuit 10. The voltage VODPP generated by each VODPP voltage generation circuit 101 is supplied to a circuit for generating the voltage VOD described above.

The voltage VPERIA generated by each VPERIA voltage generation circuit 102 is supplied to a circuit for generating the voltage VARY. As described above, the voltage VPERIA is the voltage that is also used for the operation of the peripheral circuit. Accordingly, it is necessary to dispose the VPERIA voltage generation circuit 102 in each vicinity of the central peripheral region 400 where the peripheral circuit is disposed.

A plurality of the VODPP voltage generation circuits 101 and a plurality of the VPERIA voltage generation circuits 102, and a plurality of the pads 103 are present in the data-side peripheral region 300 as well.

Figure 6:
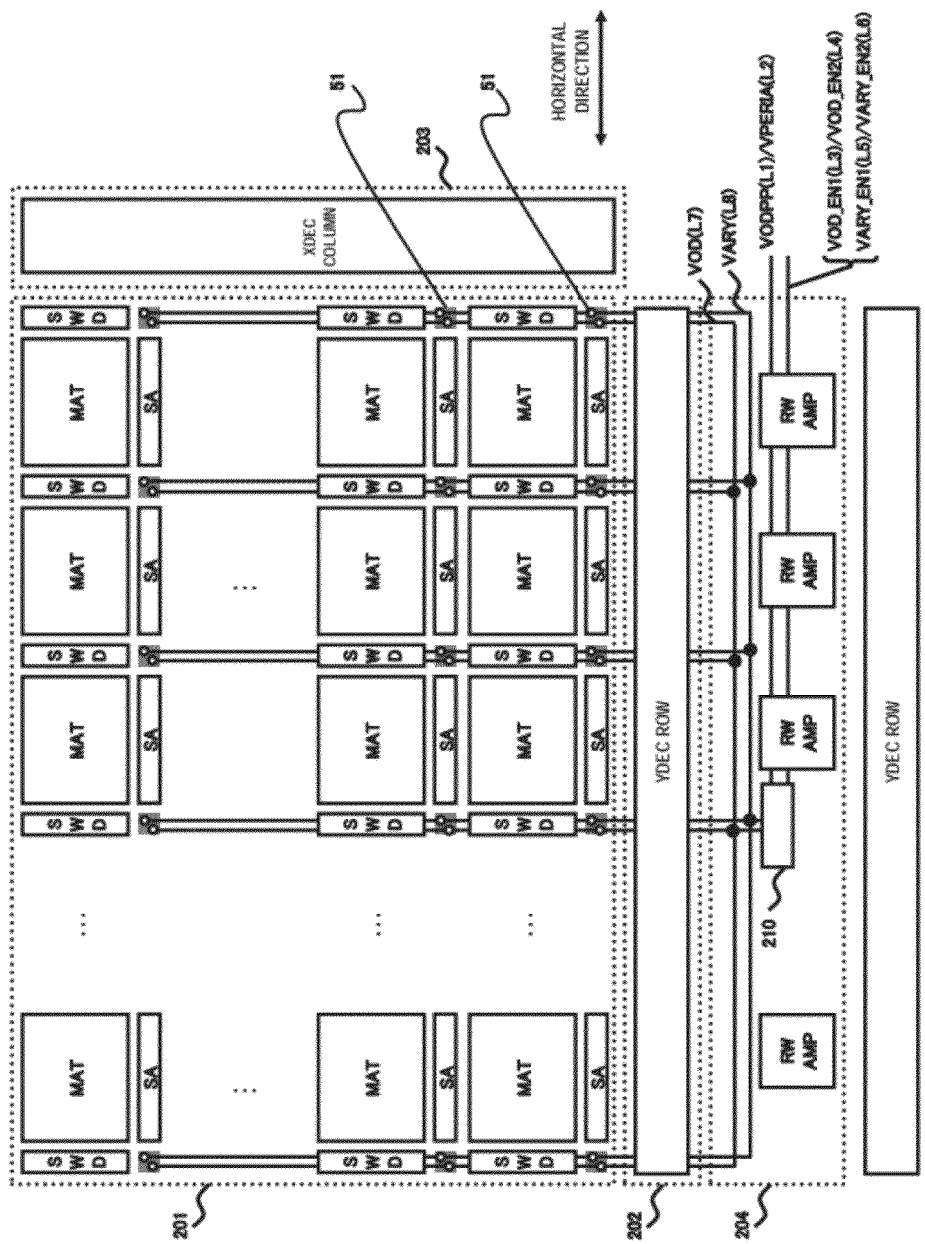
FIG. 6 is a diagram showing an example where a portion of an array region shown in FIG. 5 is enlarged.

FIG. 6 is a diagram showing an example when a portion (enclosed by a dotted line) of the array region 200 in FIG. 5 is enlarged. As shown in FIG. 6, the array region 200 is formed of memory array regions 201, column decoder region 202, row decoder region 203, and amplifier region 204.

Each memory cell array region 201 includes a plurality of memory cell arrays MAT, sense amplifiers SA associated with the memory cell arrays MAT, and subword drivers SWD associated with the memory cell arrays MAT.

Each amplifier region 204 includes a plurality of read/write amplifiers RWAMP and a VOD/VARY voltage generation circuit 210. The column decoder region includes a column decoder, which may be disposed between the memory cell arrays including memory cells. The row decoder region includes a row decoder, which may be disposed along a different side of the memory cell arrays.

The VOD/VARY voltage generation circuit 210 receives the voltage VODPP and the voltage VPERIA output by the VOOP voltage generation circuit 101 and the VPERIA voltage generation circuit 102 disposed in the address-side peripheral region 100 or the data-side peripheral region 300. The VOD/VARY voltage generation circuit 210 outputs the voltage VOD, based on activation of VOD control signals VOD_EN1 and VOD_EN2. Similarly, the VOD/VARY voltage generation circuit 210 outputs the voltage VARY, based on activation of VARY control signals VARY_EN1 and VARY_EN2.

The voltage VOD and the voltage VARY are supplied to power supply circuits for the sense amplifiers SA. A power supply circuit for each sense amplifier SA is disposed in a region where a disposition region of the subword drivers and a disposition region of the sense amplifiers SA cross (hereinafter referred to as a crossing region). Referring to FIG. 6, the crossing region is shown as a gray region.

Now, let us consider interconnects necessary for supplying the voltage VOD and the voltage VARY to the power supply circuits for the sense amplifiers SA that are present at various locations of the memory cell array region 201. As described above, the VOD/VARY voltage generation circuit 210 needs to be connected to the VODPP voltage generation circuit 101 and the VPERIA voltage generation circuit 102. For that reason, interconnects that connect both of the VODPP voltage generation circuit 101 and the VPERIA voltage generation circuit 102 to the VOD/VARY voltage generation circuit 210 are necessary.

An interconnect that connects the VOD/VARY voltage generation circuit 210 and the VODPP voltage generation circuit 101 is indicated by L1. An interconnect that connects the VOD/VARY voltage generation circuit 210 and the VPERIA voltage generation circuit 102 is indicated by L2. Referring to FIG. 6, the interconnects L1 and L2 extend to the VOD/VARY voltage generation circuit 210 in the amplifier region 204. When the name of an interconnect is written in drawings including FIG. 6, the name of the interconnect is put within a bracket immediately after the name of a voltage or a signal.

Next, let us consider an interconnect that connects the VOD/VARY voltage generation circuit 210 and the power supply circuit for each sense amplifier SA. An interconnect that supplies the voltage VOD output by the VOD/VARY voltage generation circuit 210 to the power supply circuit for each sense amplifier SA is indicated by L7. An interconnect that supplies the voltage VARY output by the VOD/VARY voltage generation circuit 210 to the power supply circuit for each sense amplifier SA is indicated by L8. The interconnects L7 and L8 extend in the amplifier region 204 in a horizontal direction, and extends in the memory cell array region 201 in a vertical direction from immediately below each crossing region.

In this manner, the voltage VOD and the voltage VARY are supplied to the power supply circuit for each sense amplifier SA in each crossing region.

Further, interconnects such as an interconnect (L3) for the VOD control signal VOD_EN1, an interconnect (L4) for the VOD control signal VOD_EN2, an interconnect (L5) for the VARY control signal VARY_EN1, and an interconnect (L6) for the VARY control signal VARY_EN2 are also necessary in order to supply the voltages to the power supply circuit for each sense amplifier SA.

In addition to the interconnects described above, an interconnect for a signal for reading or writing connected to each read/write amplifier RWA is provided for the amplifier region 204.

As described above, a lot of interconnects extend in the horizontal direction of the amplifier region 204. For that reason, the area of a region for the various interconnects is larger than the size of circuit elements in the amplifier region 204. When the area of the amplifier region 204 increases, the chip size of the semiconductor device will increase. Especially when a plurality of stages of the amplifier regions 204 (three stages in FIG. 5) are laid out, the size of one amplifier region 204 will influence the chip size in proportion to the number of the stages.

First Exemplary Embodiment

Next, a first exemplary embodiment will be described in more detail, using drawings.

An overall configuration and a layout of a semiconductor device 2 according to the first exemplary embodiment are set to be the same as the overall configuration and the layout of the semiconductor device 1. For that reason, description of the overall configuration and the layout of the semiconductor device 2 corresponding to those of FIGS. 4 and 5 will be omitted.

Figure 7:
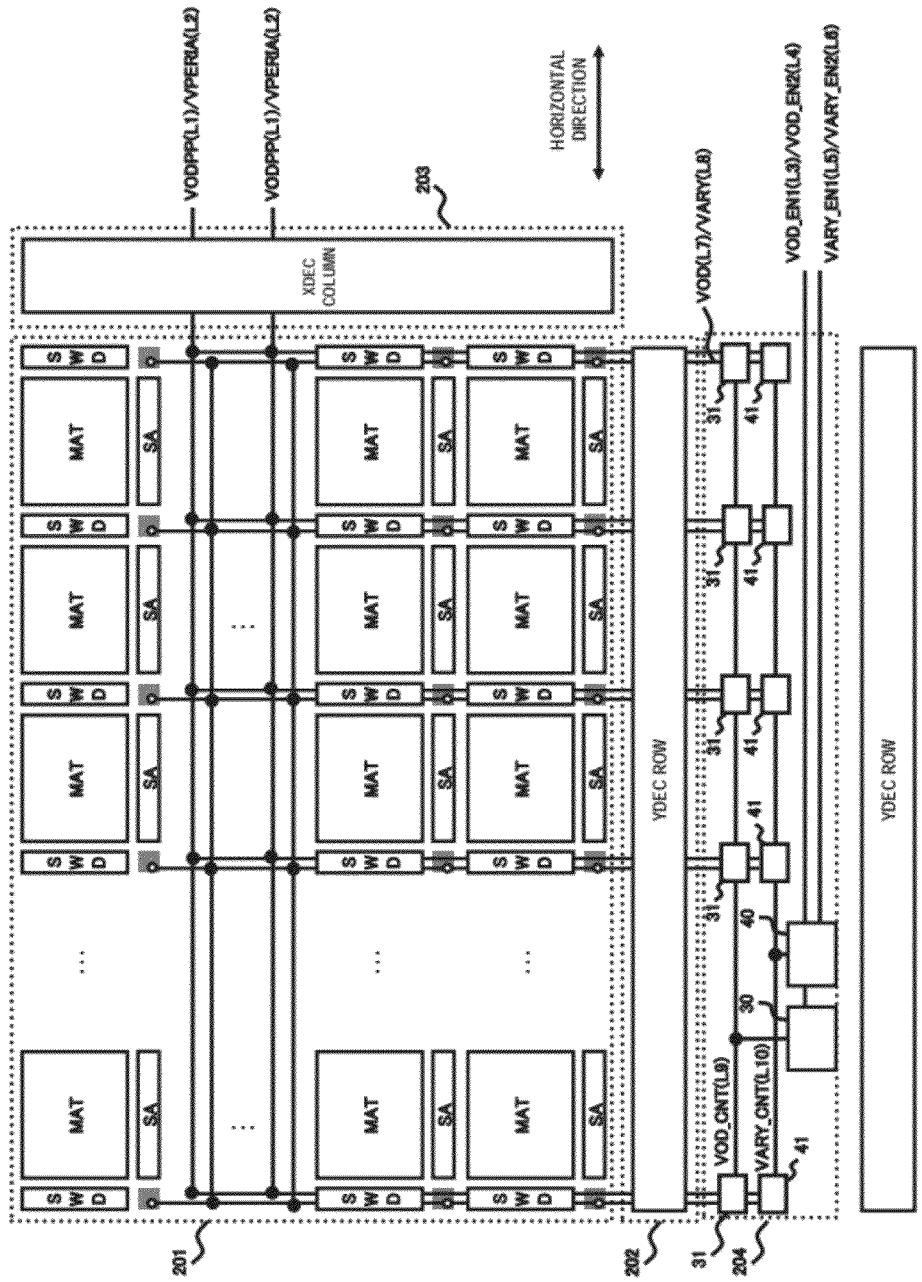
FIG. 7 is a diagram showing an example where a portion of an array region of a semiconductor device according to a first exemplary embodiment of the present disclosure is enlarged.

FIG. 7 is a diagram showing an example when the portion of the array region 200 (portion enclosed by the dotted line) in FIG. 5 is enlarged. FIG. 7 is a drawing corresponding to FIG. 6 showing the semiconductor device 1. Referring to FIG. 7, same reference symbols are assigned to components that are the same as those in FIG. 6, thereby omitting description of the components.

FIG. 7 is different from FIG. 6 in a layout of interconnects in the memory cell array region 201 and an internal configuration of the amplifier region 204. Though the amplifier region 204 in FIG. 7 also includes a plurality of read/write amplifiers RWAMP, illustration of the read/write amplifiers RWAMP is omitted for convenience for preparation of the drawing (similarly, illustration of the read/write amplifiers RWAMP is omitted in drawings subsequent to FIG. 7).

The amplifier region 204 in FIG. 7 includes a VOD voltage control unit 30, a VARY voltage control unit 40, a plurality of VOD voltage output units 31, and a plurality of VARY voltage output units 41.

Figure 8:
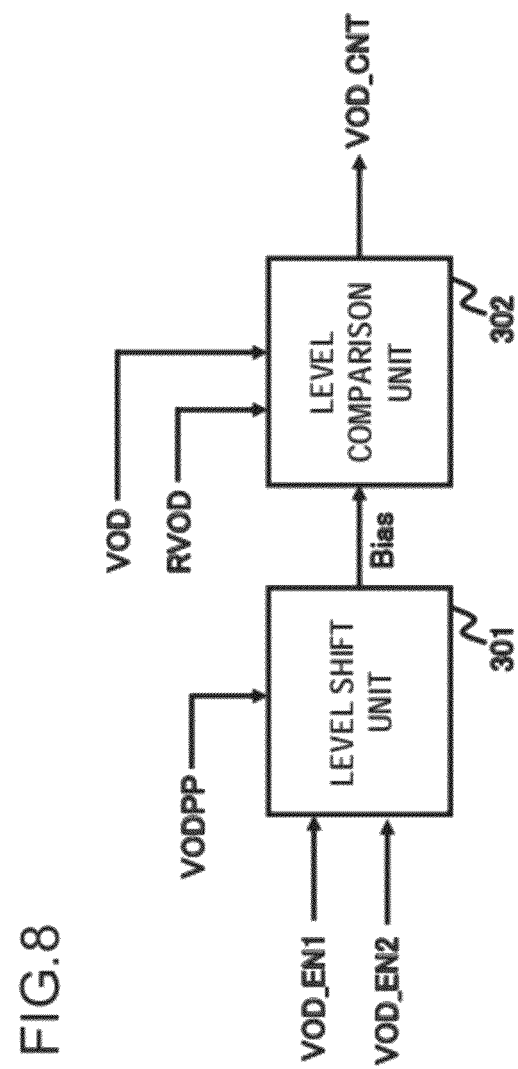
FIG. 8 is a diagram showing an example of an internal configuration of a VOD voltage control unit shown in FIG. 7.

FIG. 8 is a diagram showing an example of an internal configuration of the VOD voltage control unit 30. The VOD voltage control unit 30 is constituted from a level shift unit 301 and a level comparison unit 302.

Voltage levels of VOD control signals VOD_EN1 and VOD_EN2 are the same as a level of a voltage VPERI. Since the level of the voltage VPERI is lower than a level of a voltage VODPP, the level shift unit 301 level shifts both of the VOD control signals VOD_EN1 and VOD_EN2 to the level of the voltage VODPP. In addition, when the VOD control signals VOD_EN1 and VOD_EN2 are activated, the level shift unit 301 supplies a bias voltage to the level comparison unit 302, thereby operating (activating) the level comparison unit 302.

The level comparison unit 302 compares a level of a reference voltage RVOD for a voltage VOD and a level of the actual voltage VOD. When the level of the reference voltage RVOD is lower than the level of the voltage VOD as a result of comparison (RVOD<VOD), the level comparison unit 302 activates a VOD output control signal VOD_CNT. When the level of the reference voltage RVOD is equal to or higher than the level of the voltage VOD (RVOD≥VOD), the level comparison unit 302 deactivates the VOD output control signal VOD_CNT.

Figure 9:
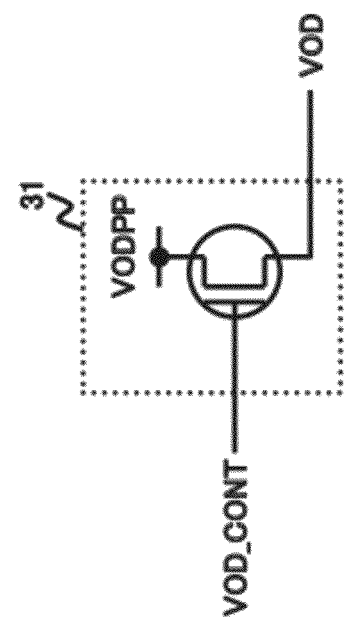
FIG. 9 is a diagram showing an example of a circuit configuration of a VOD voltage output unit shown in FIG. 7.

FIG. 9 is a diagram showing an example of a circuit configuration of each VOD voltage output unit 31. The VOD voltage output unit 31 is formed of a P-channel type MOS transistor. A source terminal of the P-channel type MOS transistor is connected to the voltage VODPP. A gate terminal of the P-channel type MOS transistor receives the VOD output control signal VOD_CNT. The P-channel type MOS transistor outputs a drain voltage as the voltage VOD.

Figure 10:
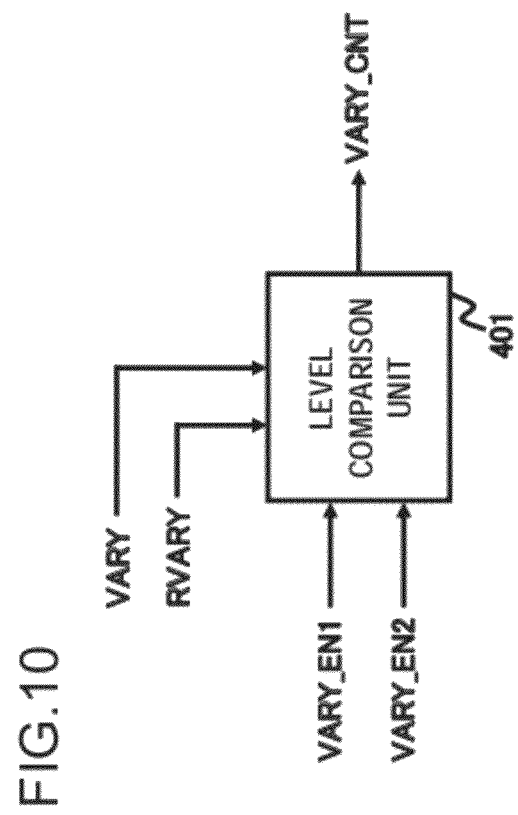
FIG. 10 is a diagram showing an example of an internal configuration of a VARY voltage control unit shown in FIG. 7.

FIG. 10 is a diagram showing an example of an internal configuration of the VARY voltage control unit 40. The VARY voltage control circuit 40 is constituted from a level comparison unit 401.

The level comparison unit 401 is activated by VARY control signals VARY_EN1 and VARY_EN2, and compares a level of a reference voltage RVARY for the voltage VARY and a level of the actual voltage VARY. When the level of the reference voltage RVARY is lower than the voltage VARY (RVARY<VARY), the level comparison unit 401 activates a VARY output control signal VARY_CNT. When the level of the reference voltage RVARY is equal to or higher than the voltage VARY (RVARY≥VARY), the level comparison unit 401 deactivates the VARY output control signal VARY_CNT.

The VARY voltage control unit 40 does not need a level shift unit, which is different from the VOD voltage control unit 30, because the voltage VPERI is higher than the voltage VARY. The voltages in this exemplary embodiment are in a magnitude relationship of VARY<VPERIA= VPERI<VOD<VODPP.

Figure 11:
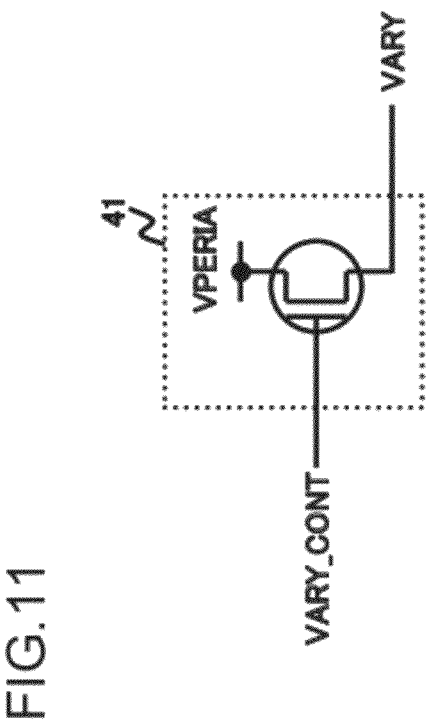
FIG. 11 is a diagram showing an example of a circuit configuration of a VARY voltage output unit shown in FIG. 7.

FIG. 11 is a diagram showing an example of a circuit configuration of each VARY voltage output unit 41. The VARY voltage output unit 41 is formed of a P-channel type MOS transistor, like the VOD voltage output unit 31. The VARY voltage output unit 41 receives a VARY output control signal VARY_CNT and outputs the voltage VARY.

Next, the layout of interconnects of the memory cell array region 201 and a layout of interconnects of the amplifier region 204 will be described, with reference to FIG. 7.

First, the layout of interconnects of the memory cell array region 201 will be described. It is noted that words such as interconnection, wire, wiring and line can be used as an alternative to the word "interconnect".

In the memory cell array region 201, the interconnects (L1 and L2) for the voltages VODPP and VPERIA extend across the memory cell array region 201 in a horizontal direction (first direction). The interconnects L1 and L2 further extend to the amplifier region 204 in a vertical direction (second and third direction). The interconnects L1 and L2 are finally connected to each of the VOD voltage output units 31 and the VARY voltage output units 41. The interconnect L7 for the voltage VOD extends from each VOD voltage output unit 31 to the memory cell array region 201. The interconnect L7 is connected to a power supply circuit 51 for each sense amplifier SA in each crossing region. Likewise, the interconnect L8 for the voltage VARY extends from each VARY voltage output unit 41 to the memory cell array region 201. The interconnect L8 is also connected to the power supply circuit 51 for each sense amplifier SA in the crossing region. It is noted that the sense amplifier SA includes a circuit having a plurality of transistors to amplify a signal on a bit line BLT.

Further, the interconnects L1 for the voltage VODPP, the interconnects L2 for the voltage VPERIA, the interconnects L7 for the voltage VOD, and the interconnects L8 for the voltage VARY are connected in a matrix form. By connecting the interconnects in the matrix form, the interconnects are parallelized. A resistance value of the memory cell array region 201 is thereby reduced. That is, by connecting the interconnects in the matrix form, the power supply interconnects in the memory array region 201 are reinforced.

Referring to FIG. 7, two systems of the interconnects are shown as the interconnects L1 and L2 extending in the horizontal direction of the memory cell array region 201. The invention is not limited to this configuration. At least one system of an interconnect should be present for the interconnects L1 and L2 extending in the horizontal direction of the memory cell array region 201. However, by increasing the number of the interconnects L1 and L2 extending in the memory cell array region 201 and connecting the interconnects in the matrix form as described above, the power supply interconnects can be reinforced.

Next, the layout of interconnects of the amplifier region 204 will be described.

In the amplifier region 204 in FIG. 7, the interconnect L3 for the VOD control signal VOD_EN1, the interconnect L4 for the VOD control signal VOD_EN2, the interconnect L5 for the VARY control signal VARY_EN1, and the interconnect L6 for the VARY control signal VARY_EN2 are routed, as in FIG. 6.

These interconnects (L3 to L6) extend to the VOD voltage control unit 30 and the VARY voltage control unit 40 in a horizontal direction of the amplifier region 204. Further, each of an interconnect (L9) for the VOD output control signal VOD_CNT and an interconnect (L10) for the VARY output control signal VARY_CNT extends in the horizontal direction of the amplifier region 204.

Next, operation of the semiconductor device 1 will be described, with reference to FIG. 7.

When the VOD control signals VOD_EN1 and VOD_EN2 are activated and then the reference voltage RVOD is lower than the voltage VOD, the VOD output control signal VOD_CNT is output from the VOD voltage control unit 30. Then, the voltage VOD is output from each VOD voltage output unit 31 in the amplifier region 204. The voltage VOD is supplied to the power supply circuit for each sense amplifier SA in the crossing region, thereby enabling operation of the sense amplifier SA.

Similarly, by activation of the VARY control signals VARY_EN1 and VARY_EN2, the voltage VARY is supplied to the power supply circuit for each sense amplifier SA in the crossing region.

Referring to FIG. 7, the VOD voltage control unit 30 and the VARY voltage control unit 40 are illustrated as being disposed in proximity to each other. The VOD voltage control unit 30 and the VARY voltage control unit 40 may be, however, disposed separated from each other.

As described above, a circuit for generating the voltage VOD is separated into the VOD voltage control unit 30 and the plurality of VOD voltage output units 31. Further, the respective VOD voltage output units 31 are distributed and disposed within the amplifier region 204. The interconnect L1 for the voltage VODPP to be supplied to this VOD voltage output unit 31 does not extend in the horizontal direction of the amplifier region 204, but extends in the horizontal and vertical directions of the memory cell array region 201. As a result, the interconnect L1 for the voltage VODPP that extends in the horizontal direction of the amplifier region 204 is eliminated. That is, the voltage VODPP and the voltage VPERIA are only locally used in the amplifier region (are used at the VOD/VARY voltage generation circuit 210 in FIG. 6). The interconnects necessary for supplying these voltages are moved from the amplifier region 204 to the memory cell array region 201.

Likewise, by separating a circuit for generating the voltage VARY into the VARY voltage control unit 40 and the plurality of VARY voltage output units 41 and distributing the respective VARY voltage output units 41 within the amplifier region 204, the interconnect L2 for the voltage VPERIA to be supplied to the VOD/VARY voltage generation circuit 210, which extends in the horizontal direction of the amplifier region 204, is eliminated.

Figure 12:
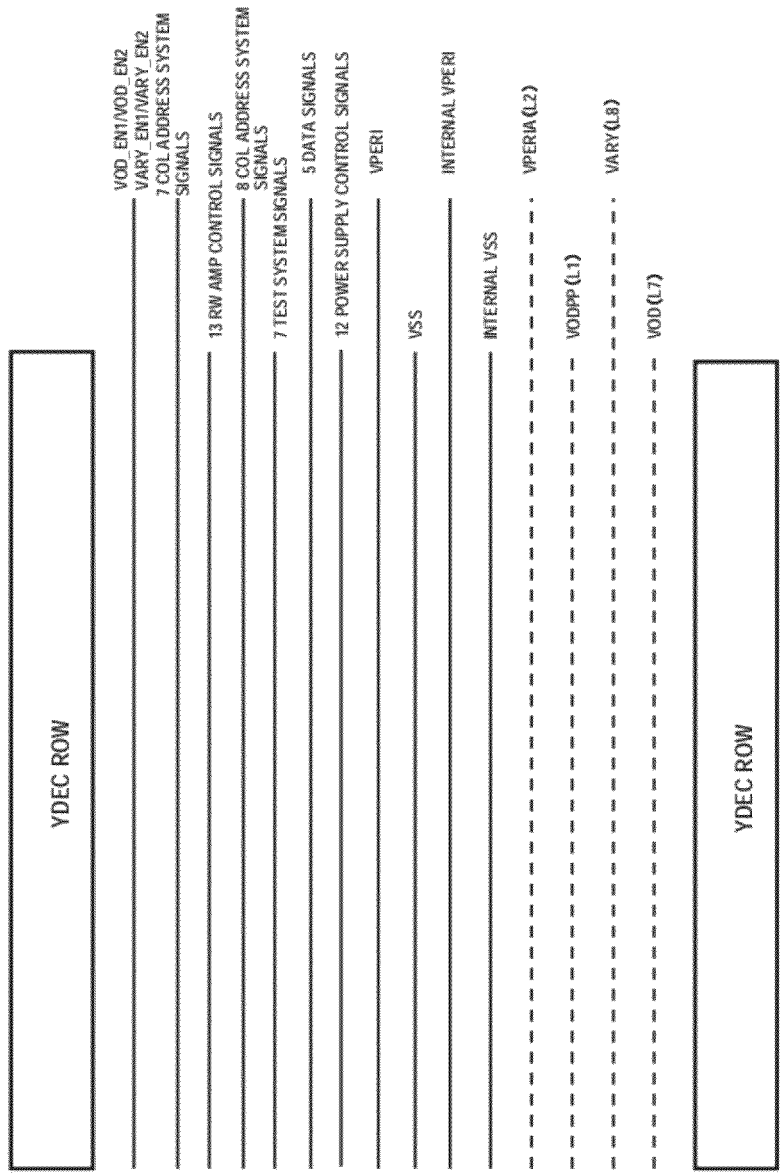
FIG. 12 is a diagram showing an example when interconnects in a horizontal direction of an amplifier region shown in FIG. 6 are illustrated.
Figure 13:
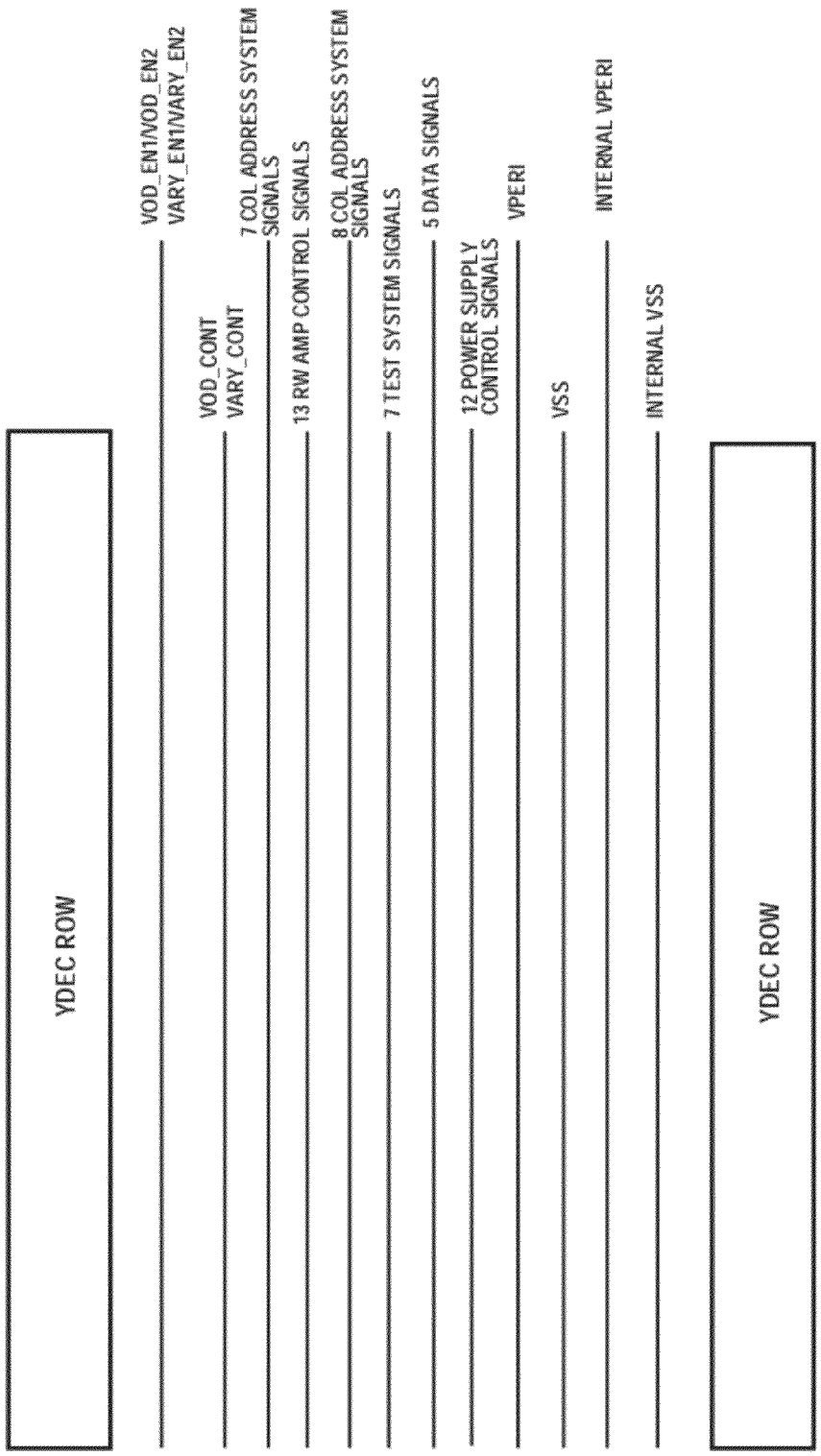
FIG. 13 is a diagram showing an example when interconnects in a horizontal direction of an amplifier region of the semiconductor device according to the first exemplary embodiment are illustrated.

FIG. 12 is a diagram showing an example when interconnects extending in the horizontal direction of the amplifier region 204 shown in FIG. 6 are illustrated. FIG. 13 is a diagram showing an example when interconnects extending in the horizontal direction of the amplifier region 204 of the semiconductor device 2 according to this exemplary embodiment are illustrated.

It can be seen from comparison between FIGS. 12 and 13 that the interconnects (L1, L2, L7, L8) for the voltages VODPP, VPERIA, VOD, and VARY are eliminated in the amplifier region 204 of the semiconductor device 2. However, the interconnect (L9) for the VOD output control signal VOD_CNT and the interconnect (L10) for the VARY output control signal VARY_CNT are added in the horizontal direction of the amplifier region 204 of the semiconductor device 2.

Signal interconnects for signal transfer and power supply interconnects for supplying power supply voltages are present in a semiconductor device. When a width of each signal interconnect is compared with a width of each power supply interconnect, the width of the power supply interconnect is overwhelmingly larger than the width of the signal interconnect. The reason for the larger width of the power supply interconnect is to reduce resistance of the power supply interconnect. When the power supply interconnect has a low resistance, effects such as improvement in immunity against noise, prevention of a circuit malfunction caused by a voltage drop, reduction of variations of circuit characteristics that depend on the layout position of the power supply interconnect can be expected. More specifically, the power supply interconnect often has a width that is several to dozen times larger than that of the signal interconnect.

Accordingly, even if the number of the interconnects (signal interconnects) for the control signals increases by two, a ratio of the interconnects in the amplifier region can be greatly reduced when the number of the power supply interconnects is reduced by four. As a result, the area of the amplifier region can be reduced, so that the chip size of the semiconductor device can be reduced.

Second Exemplary Embodiment

Next, a second exemplary embodiment will be described in detail with reference to drawings. An overall configuration and a layout of a semiconductor device 3 according to the second exemplary embodiment are set to be the same as the overall configuration and the layout of the semiconductor device 1. For that reason, description of the overall configuration and the layout of the semiconductor device 3 corresponding to those of FIGS. 4 and 5 will be omitted.

Figure 14:
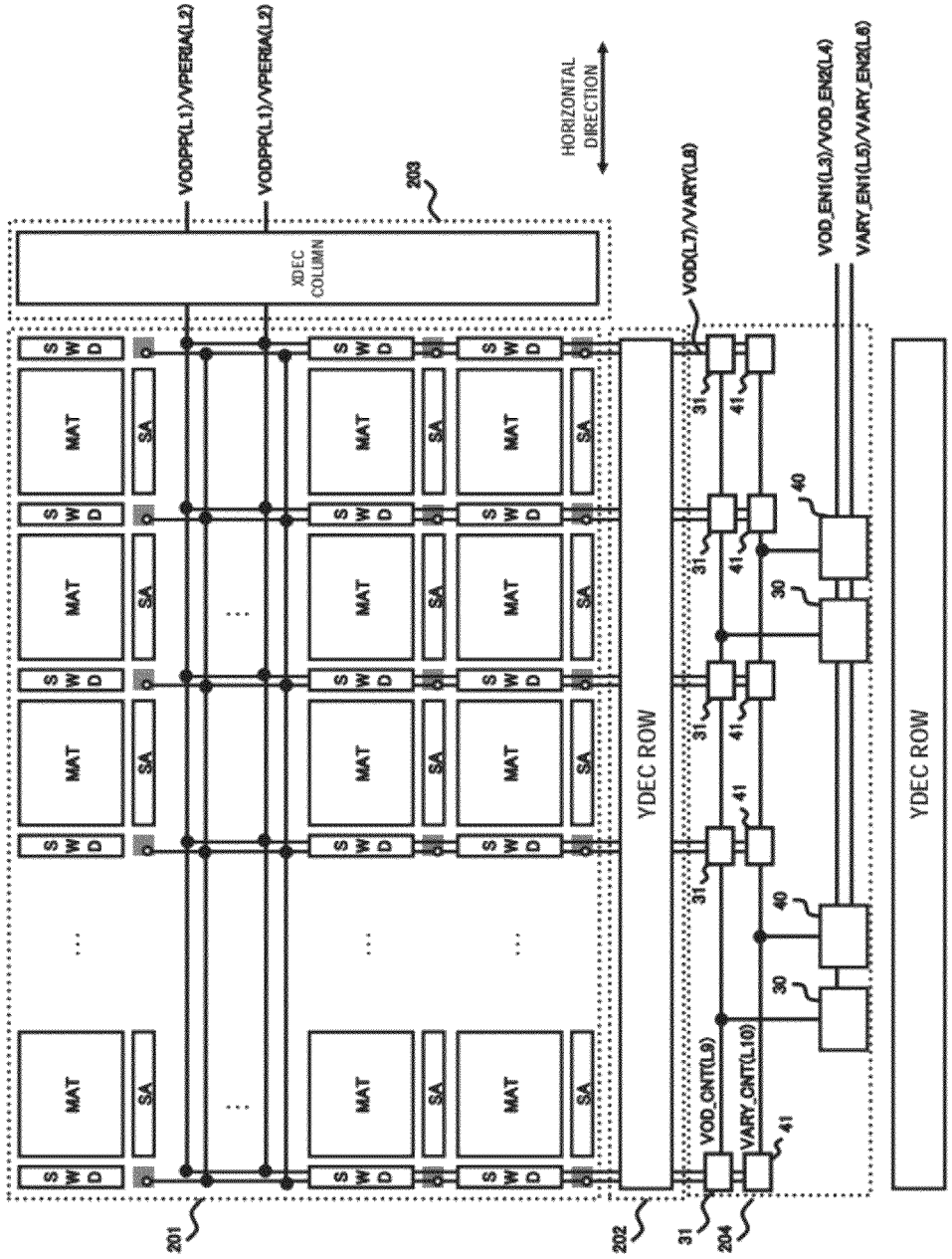
FIG. 14 is a diagram showing an example where a portion of an array region of a semiconductor device according to a second exemplary embodiment of the present disclosure is enlarged.

FIG. 14 is a diagram showing an example when the portion of the array region 200 (portion enclosed by the dotted line) in FIG. 5 is enlarged. FIG. 14 is a drawing corresponding to FIG. 7 used for description of the semiconductor device 2 in the first exemplary embodiment. Referring to FIG. 14, same reference symbols are assigned to components that are the same as those in FIG. 7, thereby omitting description of the components.

The semiconductor device 2 is different from the semiconductor device 3 in that the amplifier region 204 of the semiconductor device 3 includes a plurality of the VOD voltage control units 30 and a plurality of the VARY voltage control units 40.

By dividing and separating the VOD voltage control unit 30 and the VARY voltage control unit 40 into a plurality of the control units, the size of each control unit can be reduced.

Same functional blocks are repetitively laid out in the amplifier region due to the need of a read/write amplifier RWMP for each column or the like. When a large control unit (formed of the VOD voltage control unit 30 and the VARY voltage control unit 40) is disposed in the region where the same functional blocks are repetitively laid out, balance of the entire amplifier region 204 may be broken.

However, when the control unit is divided and separated into a plurality of control units and the plurality of control units are disposed as in the semiconductor device 3 according to this exemplary embodiment, the size of each control unit is reduced. As a result, the layout balance of the amplifier region 204 will not be broken. In addition, design latitude is also improved.

Third Exemplary Embodiment

Next, a third exemplary embodiment will be described in detail with reference to drawings. An overall configuration and a layout of a semiconductor device 4 according to the third exemplary embodiment are set to be the same as the overall configuration and the layout of the semiconductor device 1. For that reason, description of the overall configuration and the layout of the semiconductor device 4 corresponding to those of FIGS. 4 and 5 will be omitted.

Figure 15:
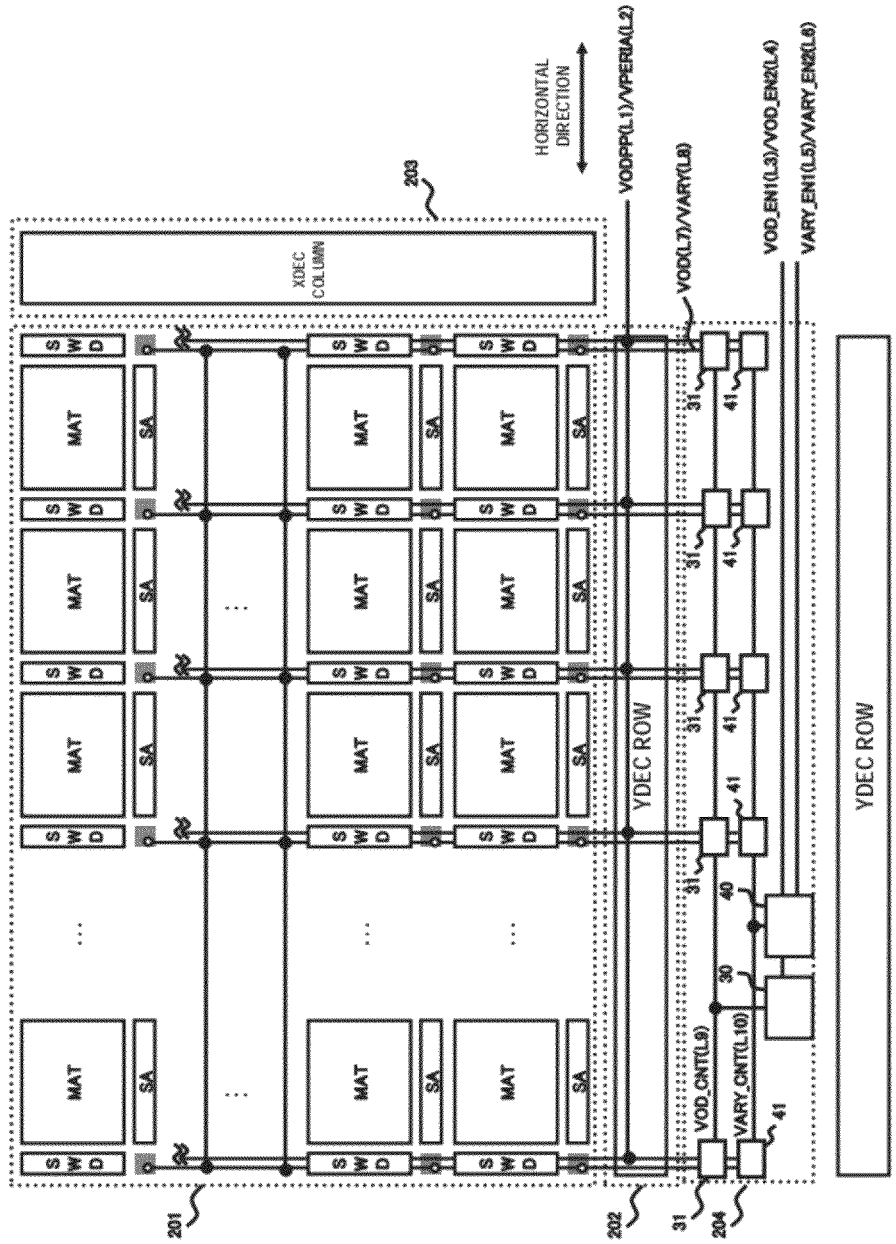
FIG. 15 is a diagram showing an example where a portion of an array region of a semiconductor device according to a third exemplary embodiment of the present disclosure is enlarged.

FIG. 15 is a diagram showing an example when the portion of the array region 200 (portion enclosed by the dotted line) in FIG. 5 is enlarged. FIG. 15 is a drawing corresponding to FIG. 7 used for description of the semiconductor device 2 in the first exemplary embodiment. Referring to FIG. 15, same reference symbols are assigned to components that are the same as those in FIG. 7, thereby omitting description of the components.

The semiconductor device 2 is different from the semiconductor device 4 in that the interconnect L1 for a voltage VODPP and the interconnect L2 for a voltage VPERIA that extend in the horizontal direction of the memory cell array 201 in the semiconductor device 2 are extended in a horizontal direction of a column decoder region 202 in the semiconductor device 4.

If there is no need for reducing widths of other interconnects that are present in the column decoder region 202 (or no need for increasing resistances of the other interconnects), and when there is room in the column decoder region 202 for extending the interconnects L1 and L2, resistances of the interconnects L1 and L2 can be reduced because the column decoder region 202 is close to the amplifier region 204.

Fourth Exemplary Embodiment

Next, a fourth exemplary embodiment will be described in detail with reference to drawings. An overall configuration and a layout of a semiconductor device 5 according to the fourth exemplary embodiment are set to be the same as the overall configuration and the layout of the semiconductor device 1. For that reason, description of the overall configuration and the layout of the semiconductor device 5 corresponding to those of FIGS. 4 and 5 will be omitted.

Figure 16:
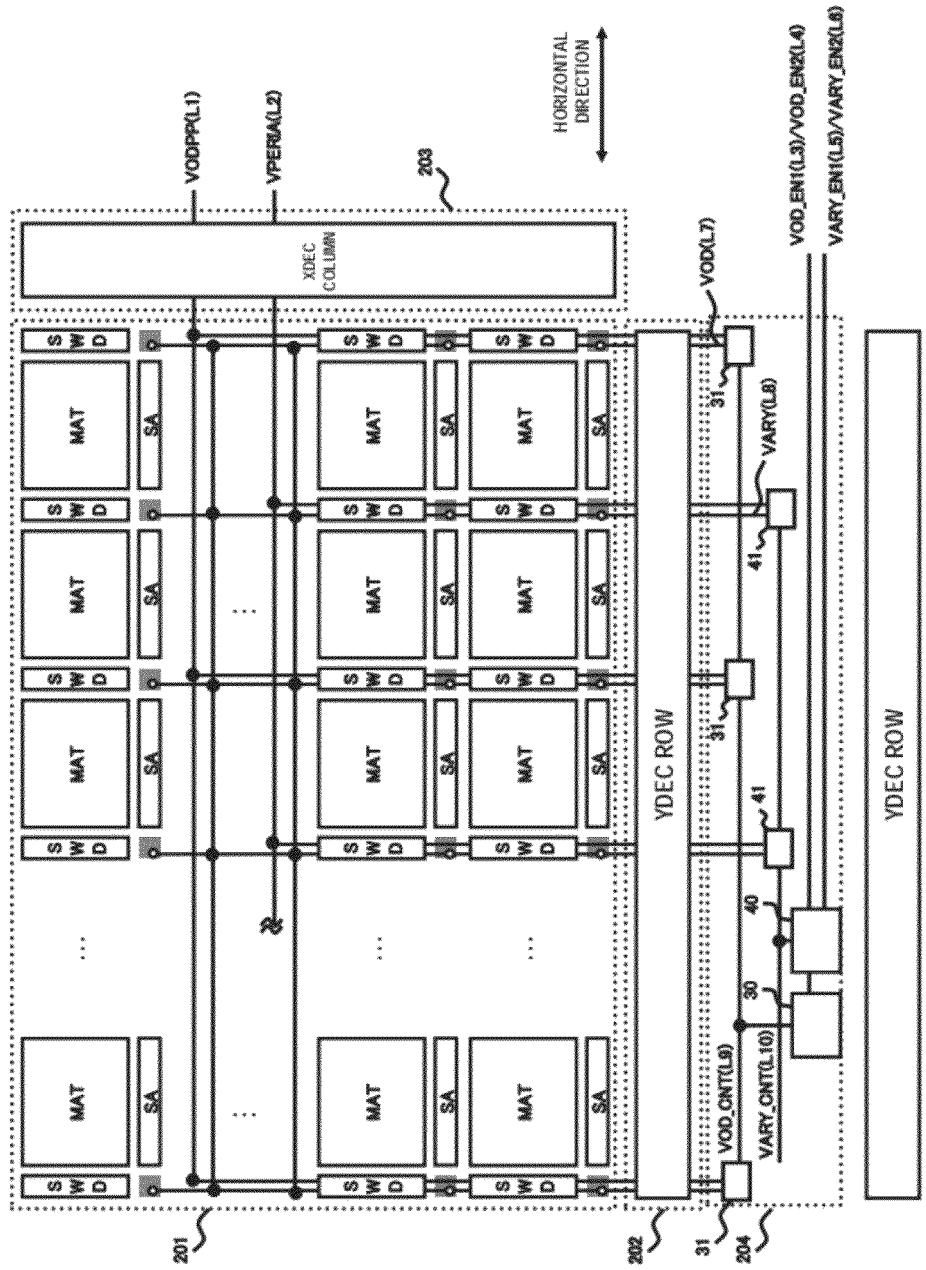
FIG. 16 is a diagram showing an example where a portion of an array region of a semiconductor device according to a fourth exemplary embodiment of the present disclosure is enlarged.

FIG. 16 is a diagram showing an example when the portion of the array region 200 (portion enclosed by the dotted line) in FIG. 5 is enlarged. FIG. 16 is a drawing corresponding to FIG. 7 used for description of the semiconductor device 2 in the first exemplary embodiment. Referring to FIG. 16, same reference symbols are assigned to components that are the same as those in FIG. 7, thereby omitting description of the components.

The semiconductor device 5 is different from the semiconductor device 2 in disposition of the VOD voltage output units 31 and the VARY voltage output units 41.

In the semiconductor device 2 (in FIG. 7), each of the VOD voltage output units 31 and each of the VARY voltage output units 41 are disposed for each sense amplifier column. In the semiconductor device 5 (in FIG. 16), the VOD voltage output units 31 and the VARY voltage output units 41 are alternately disposed for sense amplifier columns, respectively. The interconnects L1 for a voltage VODPP and the interconnects L2 for a voltage VPERIA that extend in a vertical direction of the memory cell array region 201 should be alternately routed in the layout shown in FIG. 16. Widths of the interconnects L1 and L2 can be thereby widened.

As a result, resistances of the interconnects L1 from the VODPP voltage generation circuit 101 in the address-side peripheral region 100 (or the data-side peripheral region 300) to the VOD voltage output units 31 can be reduced. Similarly, resistances of the interconnects L2 from the VPERIA voltage generation circuit 102 to the VARY voltage output units 41 can be also reduced. Since the interconnects L1 and L2 have low resistances, a power supply from each power supply generation circuit is stabilized. Characteristics of the semiconductor device 5 are thereby improved.

The reason why the VOD voltage output unit 31 and the VARY voltage output unit 41 does not necessarily need to be disposed for each sense amplifier column, as in the semiconductor device 5 according to this exemplary embodiment is that the interconnects L7 for voltages VOD and the interconnects L8 for voltages VARY are connected to one another in the memory cell array region 201.

Fifth Exemplary Embodiment

Next, a fifth exemplary embodiment will be described in detail with reference to drawings. An overall configuration and a layout of a semiconductor device 6 according to the fifth exemplary embodiment are set to be the same as the overall configuration and the layout of the semiconductor device 1. For that reason, description of the overall configuration and the layout of the semiconductor device 6 corresponding to those of FIGS. 4 and 5 will be omitted.

Figure 17:
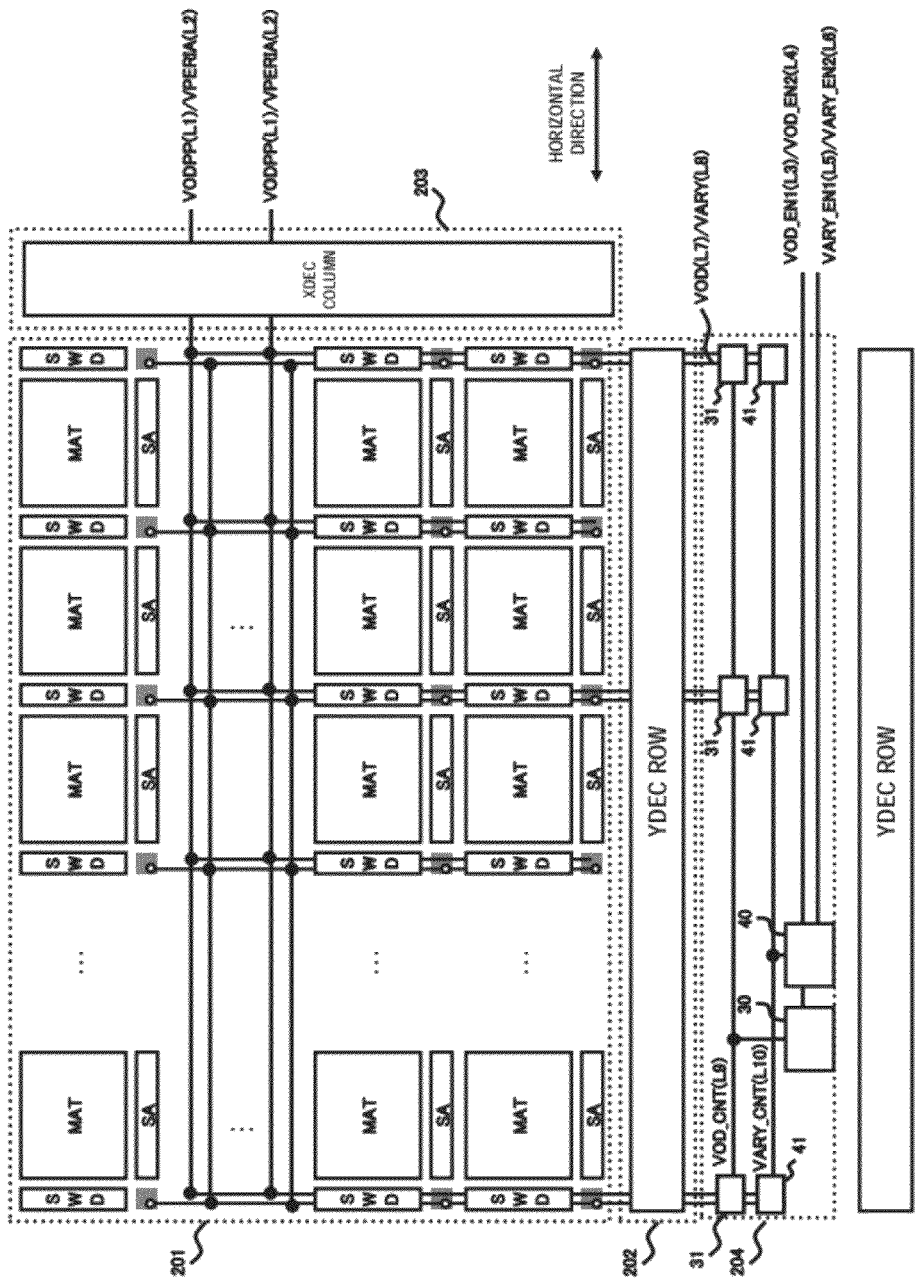
FIG. 17 is a diagram showing an example where a portion of an array region of a semiconductor device according to a fifth exemplary embodiment of the present disclosure is enlarged.

FIG. 17 is a diagram showing an example when the portion of the array region 200 (portion enclosed by the dotted line) in FIG. 5 is enlarged. FIG. 17 is a drawing corresponding to FIG. 7 used for description of the semiconductor device 2 in the first exemplary embodiment. Referring to FIG. 17, same reference symbols are assigned to components that are the same as those in FIG. 7, thereby omitting description of the components.

The semiconductor device 6 is different from the semiconductor device 2 in disposition of the VOD voltage output units 31 and the VARY voltage output units 41.

In the semiconductor device 2 (in FIG. 7), the VOD voltage output unit 31 and the VARY voltage output unit 41 are disposed for each sense amplifier column. In the semiconductor device 6 (in FIG. 17), however, there are columns in which the VOD voltage output units 31 and the VARY voltage output units 41 are not disposed. For that reason, the number of elements necessary for the amplifier region 204 can be reduced. The area of the amplifier region 204 can be further reduced, or a different element can be disposed in the amplifier region 204.

Sixth Exemplary Embodiment

Next, a sixth exemplary embodiment will be described in detail with reference to drawings. An overall configuration and a layout of a semiconductor device 7 according to the sixth exemplary embodiment are set to be the same as the overall configuration and the layout of the semiconductor device 1. For that reason, description of the overall configuration and the layout of the semiconductor device 7 corresponding to those of FIGS. 4 and 5 will be omitted.

Figure 18:
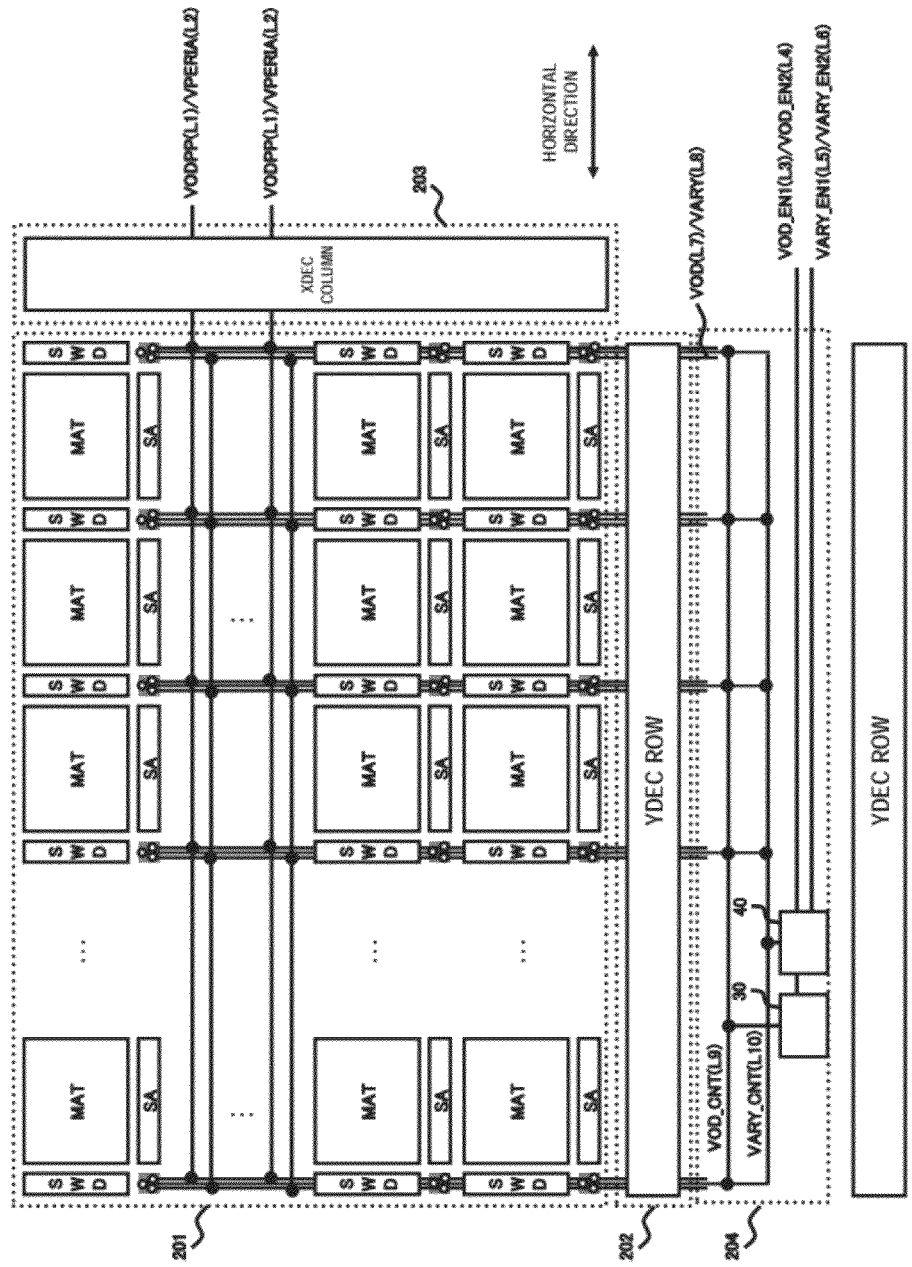
FIG. 18 is a diagram showing an example where a portion of an array region of a semiconductor device according to a sixth exemplary embodiment of the present disclosure is enlarged.

FIG. 18 is a diagram showing an example when the portion of the array region 200 (portion enclosed by the dotted line) in FIG. 5 is enlarged. FIG. 18 is a drawing corresponding to FIG. 7 used for description of the semiconductor device 2 in the first exemplary embodiment. Referring to FIG. 18, same reference symbols are assigned to components that are the same as those in FIG. 7, thereby omitting description of the components.

The semiconductor device 7 is different from the semiconductor device 2 in that elements constituting the VOD voltage output units 31 and the VARY voltage output units 41 that are present in the amplifier region 204 in the semiconductor device 2 are distributed in crossing regions within the memory cell array region 201 of the semiconductor device 7. For that reason, the interconnect L9 for a VOD output control signal VOD_CNT and the interconnect L10 for a VARY output control signal VARY_CNT extend in a vertical direction of the memory cell array region 201 and are then connected to each crossing region. Further, the interconnect L1 for a voltage VODPP and the interconnect L2 for a voltage VPERIA are also connected to each crossing region.

Figure 2:
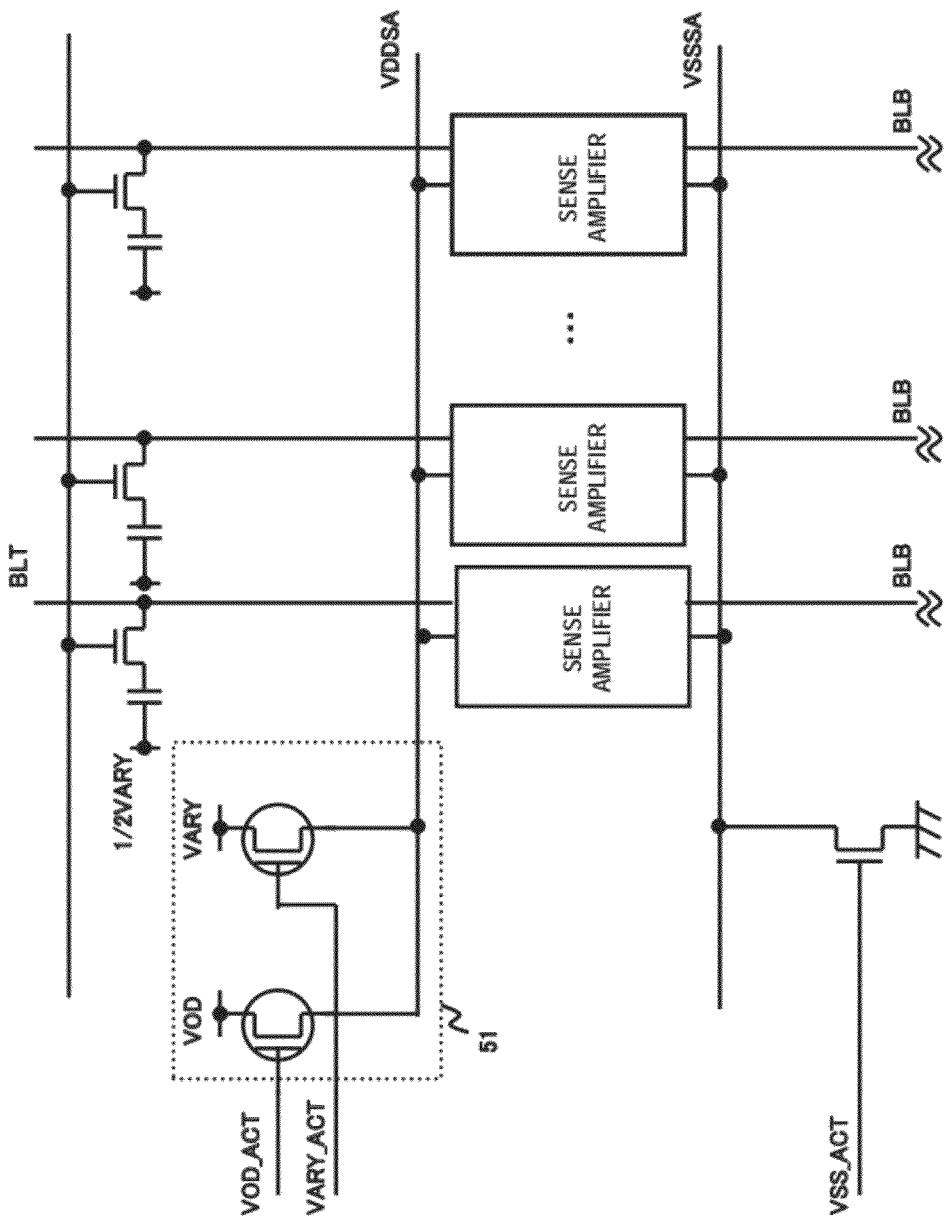
FIG. 2 is a diagram showing an example of an overdrive circuit used for a sense amplifier.
Figure 3:
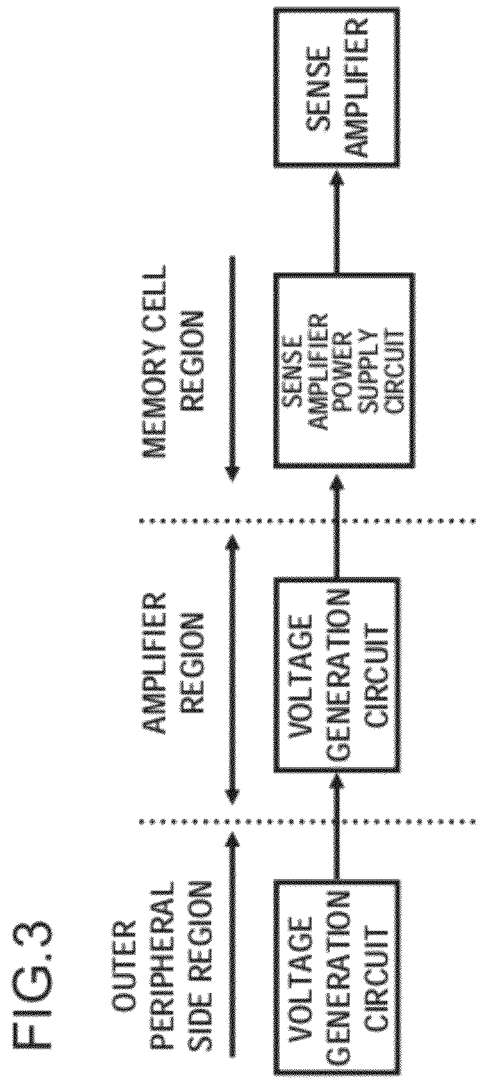
FIG. 3 is a diagram showing an example of a relationship among power supply generation circuits, for providing a power supply to a sense amplifier.
Figure 19:
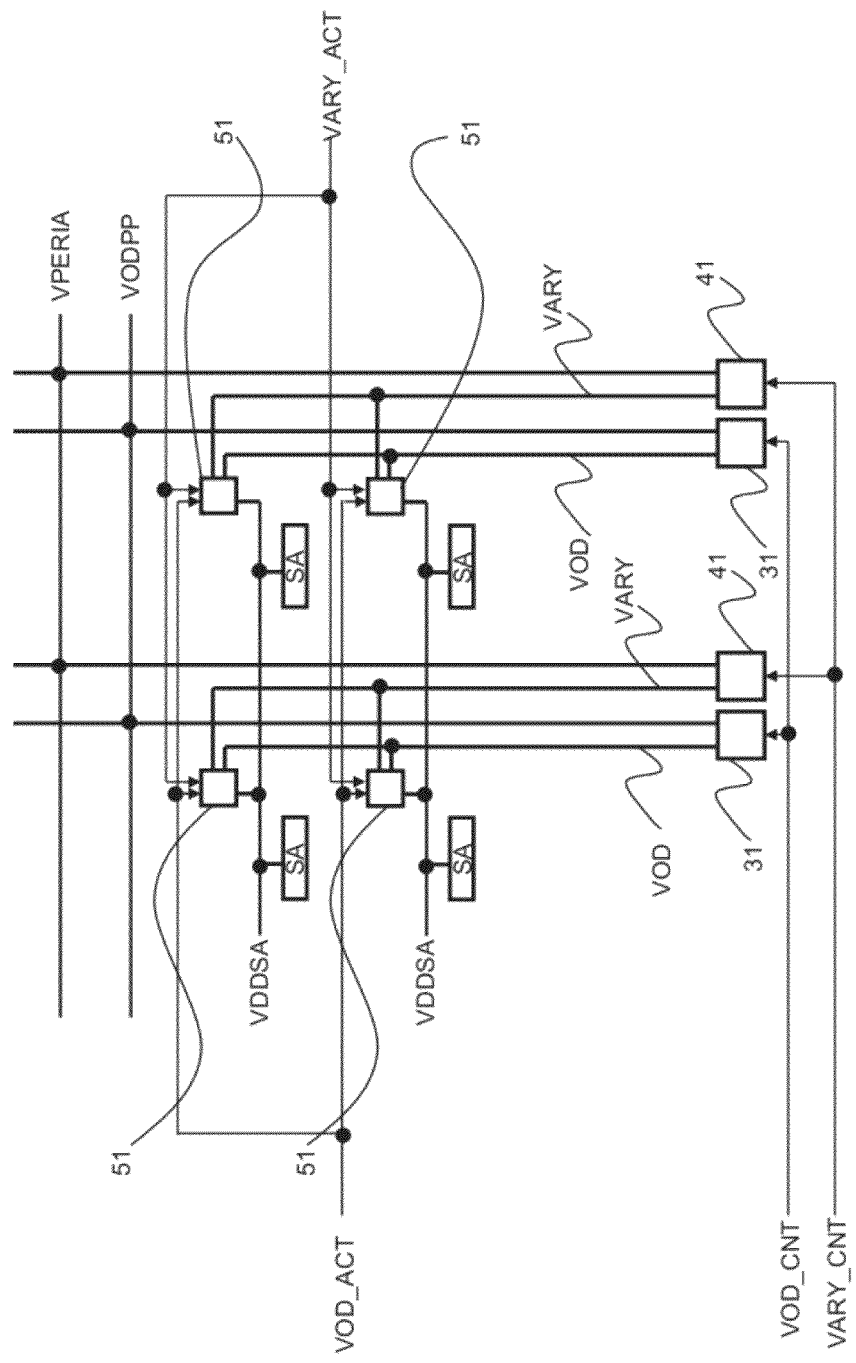
FIG. 19 is a diagram showing an example of the details of the relationships of the wirings between the sense amplifiers and the power source line VPERIA, VODPP.

FIG. 19 illustrates an example of the details of the relationships of the wirings between the sense amplifiers and the power source line VPERIA, VODPP. For example, FIG. 19 illustrates a portion in the structure shown by FIG. 7 where the four sense amplifiers are adjacently placed. The XY-decoder, MAT, SWD and the circuits 30, 40 are omitted from FIG. 7. The structure of the circuit 51 is shown in FIG. 2. The detailed explanation for FIG. 19 is omitted because it is apparent from the disclosure for FIGS. 1 to 18.

By distributing the VOD voltage output units 31 and the VARY voltage output units 41 within the crossing regions as described above, a circuit for generating a voltage VOD (circuit for generating a voltage VARY) and a circuit for consuming the voltage VOD (voltage VARY) can be made to be close to each other. Widths of the interconnect L7 for the voltage VOD and the interconnect L8 for the voltage VARY can be more narrowed.

As a result, when there is room for disposing elements (transistors) of the VOD voltage output unit 31 and the VARY voltage output unit 41 in each crossing region, resistance reduction of the power supply interconnects can be further achieved.

Each disclosure of the cited Patent Documents listed above is incorporated herein by reference. Modifications and adjustments of the exemplary embodiments are possible within the scope of the overall disclosure (including claims) of the present invention, and based on the basic technical concept of the invention. Various combinations and selections of various disclosed elements are possible within the scope of the claims of the present invention. That is, the present invention of course includes various variations and modifications that could be made by those skilled in the art according to the overall disclosure including the claims and the technical concept. To take an example, in the description of each exemplary embodiment, the layout of the semiconductor device was described as a so-called edge pad type layout. However, the layout of the semiconductor device may be of a center pad type where a pad column is present at the center of a chip.

What is claimed is:

1. A semiconductor device, comprising:
   a first region including a plurality of memory cells each of which holds respective data and a plurality of sense amplifiers that respectively amplify the data in the plurality of memory cells, based on a first voltage; and
   a second region provided along a side of the first region and including a first power supply generation circuit that generates the first voltage, based on a second voltage;
   the second voltage being supplied to the first power supply circuit via a first power supply interconnect extending on the first region in a first direction parallel to one side of the first region.

2. The semiconductor device according to claim 1, wherein an interconnect which extends for supplying the second voltage to the first power supply generation circuit, in parallel with the first power supply interconnect does not exist on the second region.

3. The semiconductor device according to claim 1, further comprising:
   a column decoder disposed between the first and second regions; and
   a row decoder disposed along a different side of the first region perpendicular to said one side of the first region.

4. The semiconductor device according to claim 1, wherein the second region further includes a second power supply generation circuit that generates a third voltage to be used for amplifying each of the plurality of sense amplifiers, based on a fourth voltage; and the fourth voltage is supplied to the second power supply generation circuit via a second power supply interconnect extending on the first region in the first direction.

5. The semiconductor device according to claim 4, wherein the first power supply generation circuit includes at least one first voltage control unit and a plurality of first voltage output units whose active state and inactive state are determined by the first voltage control unit; and
the second power supply generation circuit includes at least one second voltage control unit and a plurality of second voltage output units whose active state and inactive state are determined by the second voltage control unit.

6. The semiconductor device according to claim 4, wherein the first power supply generation circuit includes a plurality of the first voltage control units, and the second power supply circuit includes a plurality of the second voltage control units.

7. The semiconductor device according to claim 3, wherein the first power supply interconnect extends on a region where the column decoder is formed, in the first direction.

8. The semiconductor device according to claim 4, wherein the first region includes a plurality of memory cell regions each containing a plurality of memory cells, a plurality of sense amplifier regions each containing a plurality of sense amplifiers, and a plurality of subword driver regions each containing a plurality of subword drivers, and a sense amplifier power supply circuit associated with each of the sense amplifiers is provided in each of a plurality of crossing regions surrounded by a plurality of the sense amplifier regions and a plurality of the subword driver regions; and
the first and third voltages are supplied from each of the crossing regions to each of the sense amplifier power supply circuits via a second power supply interconnect and a third power supply interconnect extending in a second direction orthogonal to the first direction.

9. The semiconductor device according to claim 4, wherein the first region includes a plurality of memory cell regions each containing the plurality of memory cells, a plurality of sense amplifier regions each containing the plurality of sense amplifiers, and a plurality of subword driver regions each containing a plurality of subword drivers, and a sense amplifier power supply circuit associated with each of the sense amplifiers is provided in each of a plurality of crossing regions surrounded by a plurality of the sense amplifier regions and a plurality of the subword driver regions;
the first voltage is supplied from each of the crossing regions to each of the sense amplifier power supply circuits via a second power supply interconnect extending in a second direction orthogonal to the first direction;
the third voltage is supplied to each of the sense amplifier circuits via a third power supply interconnect extending in the second direction; and
the second power supply interconnect extends along a first sense amplifier column disposed in the second direction, and the third power supply interconnect extends along a second sense amplifier column adjacent to the first sense amplifier column.

10. The semiconductor device according to claim 4, wherein the first region includes a plurality of memory cell regions each containing the plurality of memory cells, a plurality of sense amplifier regions each containing the plurality of sense amplifiers, and a plurality of subword driver regions each containing a plurality of subword drivers, and a sense amplifier power supply circuit associated with each of the sense amplifiers is provided in each of a plurality of crossing regions surrounded by a plurality of the sense amplifier regions and a plurality of the subword driver regions;
the first and third voltages are supplied from each of the crossing regions to each of the sense amplifier power supply circuits via second and third power supply interconnects extending in a second direction orthogonal to the first direction; and
the second and third power supply interconnects extend along at least one of sense amplifier columns disposed in the second direction.

11. The semiconductor device according to claim 5, wherein
the first region includes a plurality of memory cell regions each containing the plurality of memory cells, a plurality of sense amplifier regions each containing the plurality of sense amplifiers, and a plurality of subword driver regions each containing to a plurality of subword drivers, and a sense amplifier power supply circuit associated with each of the sense amplifiers is provided in each of a plurality of crossing regions surrounded by a plurality of the sense amplifier regions and a plurality of the subword driver regions; and
the first and second voltage output units are disposed in the crossing regions rather than the second region.

12. A semiconductor device comprising:
a memory cell array region, and
an amplifier region; wherein
said memory cell array region includes:
    a plurality of memory cell each of which holds respective data;
    a plurality of sense amplifier that respectively amplify the data in the plurality of memory cells, based on an array voltage and an overdrive voltage;
    a plurality of subword driver; and
    a plurality of sense amplifier power supply circuit that are provided in a plurality of crossing regions respectively surrounded by a plurality of sense amplifier regions and a plurality of subword driver regions and supply power to the sense amplifiers, said sense amplifier regions being respectively assigned to the sense amplifiers, and said subword driver regions being respectively assigned to the subword drivers; and wherein
said amplifier region includes:
    an array voltage generation circuit that generates the array voltage based on a first peripheral voltage and an overdrive voltage generation circuit that generates the overdrive voltage, based on a second peripheral voltage, and disposed along one side of the memory cell array region;
the first peripheral voltage being supplied to the array voltage generation circuit via a first power supply interconnect extending on the memory cell array in a first direction parallel to said one side of the memory cell array region;
the second peripheral voltage being supplied to the overdrive voltage generation circuit via a second power supply interconnect extending on the memory cell array in the first direction;
the array voltage generation circuit including at least one array voltage control unit and a plurality of array voltage output units whose active state and inactive state are determined by the array voltage control unit;

the overdrive voltage generation circuit including at least one overdrive voltage control unit and a plurality of overdrive voltage output units whose active and inactive states are determined by the overdrive voltage control unit; and the array voltage and the overdrive voltage being supplied from each of the crossing regions to each of the sense amplifier circuits via an array power supply interconnect and an overdrive power supply interconnect extending in a second direction orthogonal to the first direction.

13. A semiconductor device comprising:
a first power source wiring extending in a first direction receiving a first power source voltage;
a first transistor;
a first wiring coupled between the first power source wiring and the first transistor, the first wiring extending from the first power source wiring in a second direction perpendicular to the first direction;
a second transistor;
a second wiring coupled between the first and second transistors, the second wiring extending from the first transistor in a third direction opposite and parallel to the second direction;
a first transistor circuit configured to be operated by the first power source voltage; and
a third wiring coupled between the second transistor and the first transistor circuit, the third wiring extending in the first direction.

14. The semiconductor device according to claim 13, further comprising:
a memory cell array region including a plurality of memory cells,
wherein the power source wiring is placed over the memory cell array region.

15. The semiconductor device according to claim 13, further comprising:
a decoder region where a decoder circuit is provided,
wherein the power source wiring is placed over the decoder region.

16. The semiconductor device according to claim 13, further comprising:
a third transistor coupled to the second wiring;
a second transistor circuit configured to be operated by the first power source voltage; and
a fourth wiring coupled between the third transistor and the second transistor circuit, the fourth wiring extending in the first direction.

17. The semiconductor device according to claim 16, further comprising:
a second power source wiring extending in the first direction and receiving a second power source voltage different from the first power source voltage;
a fourth transistor;
a fifth wiring coupled between the second power source wiring and the fourth transistor, the fourth wiring extending from the second power source wiring in the second direction;
a fifth transistor coupled to the third wiring;
a sixth wiring coupled between the fourth and fifth transistors, the sixth wiring extending from the fourth transistor in the third direction.

18. The semiconductor device according to claim 17, further comprising:
a six transistor coupled between the fourth wiring and the six wiring.

19. The semiconductor device according to claim 18, wherein the first transistor circuit is a sense amplifier.

20. The semiconductor device according to claim 13, further comprising:
a control signal wiring extending in the first direction to apply a control signal to the first transistor.

* * * * *